United States Patent
Nuytkens et al.

(10) Patent No.: US 6,200,709 B1
(45) Date of Patent: Mar. 13, 2001

(54) PHOTOLITHOGRAPHIC MASK AND APPARATUS AND METHOD OF USE THEREOF

(75) Inventors: Peter R. Nuytkens, Melrose; Ahmed Mitwalli, Cambridge, both of MA (US)

(73) Assignee: Custom One Design, Inc., Melrose, MA (US)

( * ) Notice: Subject to any disclaimer, the term of this patent is extended or adjusted under 35 U.S.C. 154(b) by 0 days.

(21) Appl. No.: 09/232,349

(22) Filed: Jan. 15, 1999

(51) Int. Cl.$^7$ .................................................. G03F 9/00
(52) U.S. Cl. .................................................. 430/5; 355/53
(58) Field of Search ........................... 430/5, 22; 355/53, 355/77

(56) References Cited

U.S. PATENT DOCUMENTS

| | | | |
|---|---|---|---|
| 5,932,884 | * 8/1999 | Aizaki | 250/492.23 |
| 5,994,006 | * 11/1999 | Nishi | 430/22 |
| 5,995,200 | * 11/1999 | Pierrat | 355/53 |

* cited by examiner

*Primary Examiner*—S. Rosasco
(74) *Attorney, Agent, or Firm*—Perkins, Smith & Cohen, LLP; Jacob N. Erlich; Jerry Cohen

(57) ABSTRACT

A photolithographic system uses a mask that carries a plurality of photolithographic images. In one embodiment, the mask carries images for all the layers necessary to manufacture a variety of different device cells, which can include devices of different types. A single mask may carry the images required to make a complete system consisting of multiple devices. Some devices may comprise multiple layers. The system includes an adjustable aperture system which defines the area of the mask which will be illuminated. The mask is employed in a mask aligner which includes a source of electromagnetic radiation, apparatus to carry and position a substrate, apparatus to position the mask, and apparatus to position and adjust the aperture. The process requires the successive steps of supporting a photoresist-carrying substrate, positioning the mask to register a selected photolithographic image with the substrate, positioning and adjusting the aperture to expose the desired image, and illuminating the radiation source to imprint the chosen image on the substrate. The alignment process may be repeated multiple times with the same mask and adjustable aperture so as to imprint other images of the corresponding layer of other devices elsewhere on the substrate. The substrate is processed to produce the layers of the devices so imprinted. The photolithographic process may then be repeated to imprint successive layers of the various devices, each in registry with the corresponding underlying layers.

12 Claims, 14 Drawing Sheets

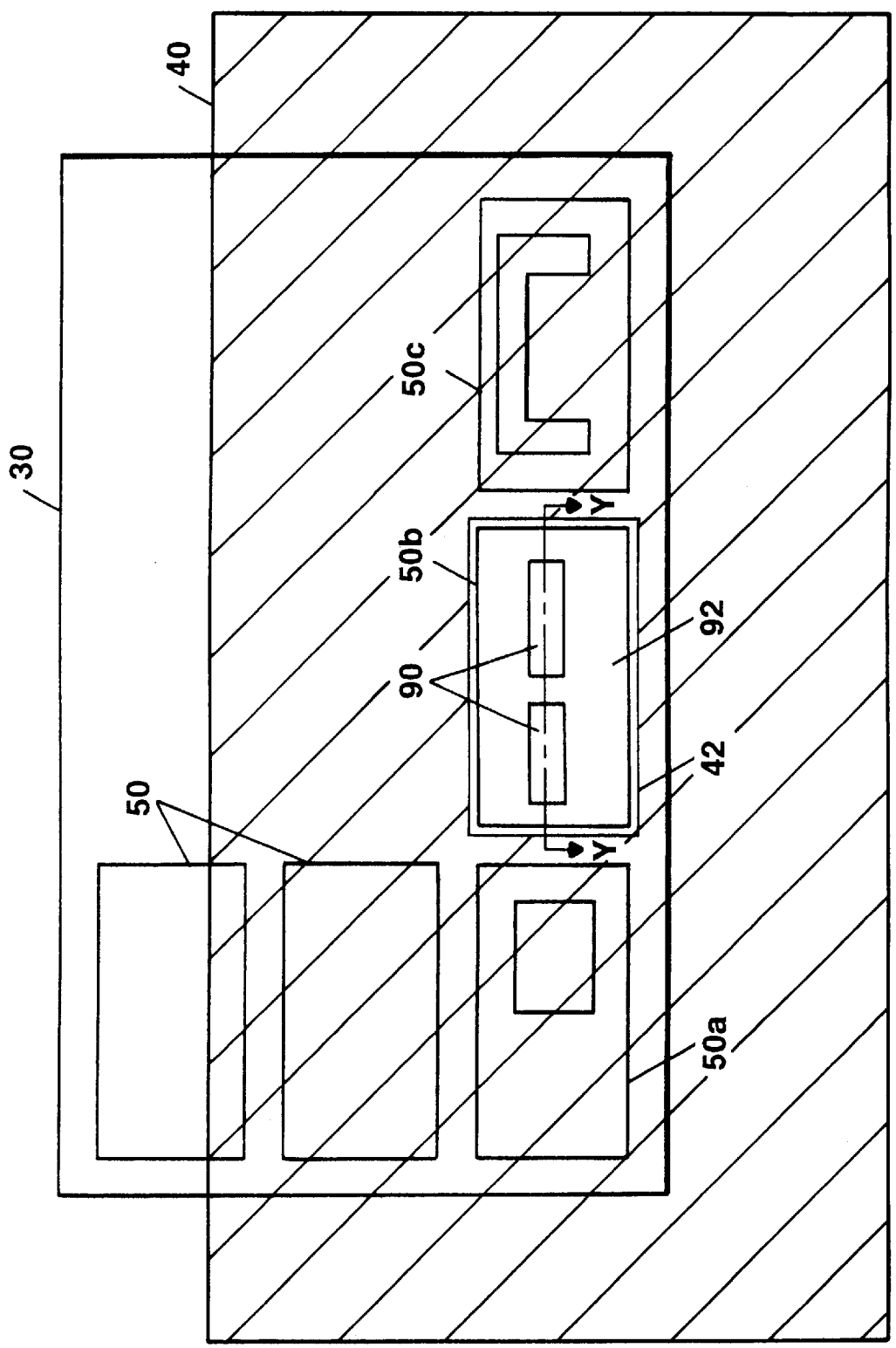

A photolithographic system is presented which uses a mask that carries a plurality of photolithographic images. In one aspect, the invention includes a photolithographic mask having a plurality of images which are suited to the manufacture of multiple device cells of more than one type. In one embodiment the cells may include such types as digital circuitry, analog circuitry, micromechanical devices, microelectromechanical devices, electrooptic devices, optoelectronic devices, and electronic sensor devices. In another embodiment, the mask includes a set of images for one cell that requires more than one layer for its manufacture.

PHOTOLITHOGRAPHIC MASK AND APPARATUS AND METHOD OF USE THEREOF

FIELD OF THE INVENTION

The present invention relates to an apparatus and method for the photolithographic manufacture of devices, and more particularly to an apparatus and method for using a photolithographic mask in the manufacture of devices.

BACKGROUND

Photolithography is a well known technique in the manufacture of many kinds of devices, and finds particular use in the semiconductor industry. Photolithography is very effectively employed in the mass production of semiconductor devices. However, it suffers from a drawback in the manufacture of devices which are required in very small numbers, and in the prototyping of devices. Photolithography is a method which uses masks. The cost of making many expensive masks may be prohibitively high if a product is to be manufactured in quantities of only a few units, or if a prototype has to be modified multiple times during development. Some of the methods which have been developed to try to avoid these difficulties include device modeling and direct write technology.

Device modeling generally uses a computer to calculate, or "model," the behavior of a circuit or other device of interest. While modeling can provide important insights into the expected behavior of devices, and is generally faster and less expensive to perform than the actual fabrication of the modeled device, one obtains only a calculated result, and not an actual device of interest. Furthermore, modeling generally requires that simplifying assumptions be made to provide a tractable mathematical representation of the device under investigation. These simplifying assumptions generally cause the calculated answers to be approximations to the actual behavior of real devices.

Direct write technology generally employs a method of "writing" the patterns representing the various layers or levels of a device without a mask, by the direct illumination of a substrate with a very finely focused beam, such as an electron beam.

The patterns to be created or "written" are generally maintained in digital form in the memory of a digital computer, and are used to scan the electron beam over the surface of the substrate, and to turn the beam on and off as appropriate to generate the desired pattern. While the method can be used to produce devices, it typically suffers from the difficulties that the equipment required to carry out the process is generally more expensive than photolithography equipment, and that the process is generally slower than production using photolithography.

SUMMARY OF THE INVENTION

In another aspect, the invention comprises a photolithographic system for employing photolithographic masks which have a plurality of images. The system includes a source of electromagnetic radiation, a substrate support, a mask positioner, and an adjustable aperture which can be moved and which is positioned between the source of electromagnetic radiation and the substrate support. An embodiment of this system includes an aperture which has a plurality of individually movable screens.

Still another aspect of the invention is a photolithographic process for the manufacture of a device. The process includes the steps of providing a source of electromagnetic radiation, supporting a substrate of material suitable for photolithographic processing, and positioning a photolithographic mask having a plurality of images in registry with the substrate. An aperture is positioned between the source of electromagnetic radiation and the substrate so as to permit a first image to be projected onto the substrate and the substrate is exposed to electromagnetic radiation through the aperture to imprint the first image upon the substrate. The photolithographic mask is then repositioned relative to the substrate so that a second of the images is in registry with the substrate. The aperture is then repositioned to permit the second image to be projected onto the substrate, and the substrate is reexposed to electromagnetic radiation through the aperture to imprint the second image upon the substrate. This process is repeated as many times as necessary to imprint the images required to manufacture the desired device, one layer at a time. In an embodiment of this invention, a processing step is interposed between the step of imprinting the first image and the step of imprinting the second image.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

FIGS. 2a though 2j depict a plan view of an embodiment of the mask shown in FIG. 1 and constructed in accordance with the invention in which FIG. 2a depicts an overview and FIGS. 2b through 2j depict individual images;

DETAILED DESCRIPTION OF THE INVENTION

In the following description, the term "cell" is meant to denote a basic unit of construction of a device, which includes but is not limited to single elements such as resistors, capacitors, diodes, and transistors, groups of such elements together which comprise memory elements, logic gates, bridges, and the like, and micromechanical or microelectromechanical elements such as fulcrums, levers, and gears, and the like. Similarly, the term "device" is meant to denote a structure composed of one or more cells, which includes but is not limited to components ranging from single elements such as serpentine resistors, to objects such as accelerometers, microelectromechanical motors, photodiodes, and optical sensors, to complex structures such as random access memories, central processing units, charge coupled devices, and the like. A single photolithographic image will generally represent a single level or layer which is required for the manufacture of a device by photolithographic processing. A photolithographic mask having a plurality of photolithographic images thereon may be considered to represent a library of images. Photolithographic images will generally be depicted as rectangular objects, which is a convenient shape for use in presenting embodiments of the invention, but it should be recognized that other shapes, such as triangles, hexagons, circles, or even irregular shapes, may be used in embodiments according to the invention.

Figure 1:
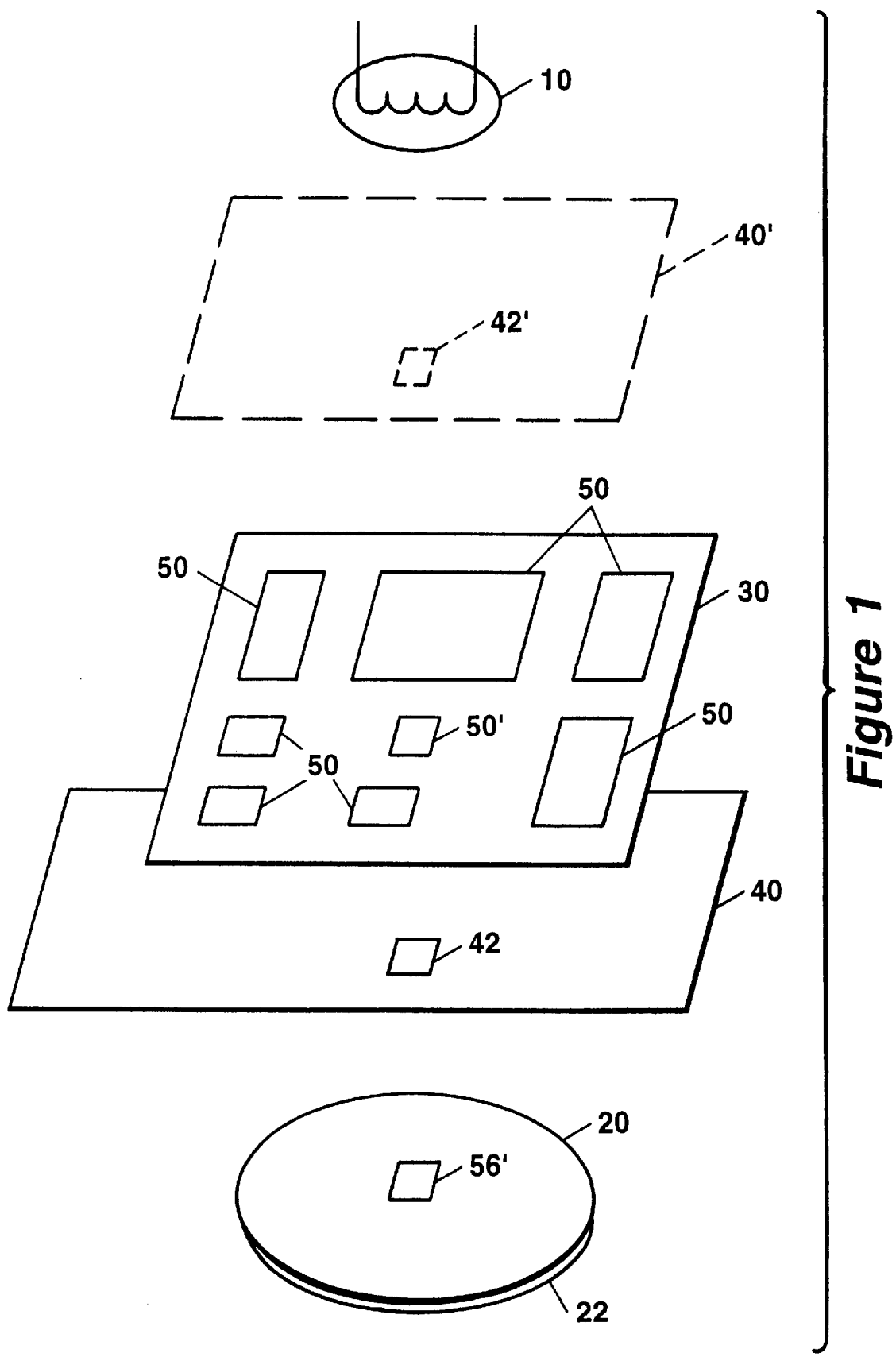
FIG. 1 depicts a highly schematic diagram of an embodiment of the photolithographic system of the invention.

FIG. 1 depicts a schematic general overview of the photolithographic system of the invention which includes a source of electromagnetic radiation 10. The source 10 is selected to provide radiation of a suitable wavelength, and may be any source of suitable intensity including but not limited to a solid state laser, a dye laser, an excimer laser, or a lamp. The source 10 in one embodiment is a more complex source which includes frequency doubling of a selected source and the like. A substrate 20, which may be a material such as a semiconductor, an insulator, or a metal, and which is provided with a suitable photoresist, not shown, is supported by a substrate support 22 in a position where the substrate 20 is illuminated by the source 10. A photolithographic mask 30 which carries a plurality of photolithographic images, generally 50, is disposed between the source 10 and the substrate 20, so that radiation passing from the source 10 to the substrate 20 through the mask 30 imprints a selected image 50' on photoresist on the substrate 10 as imprinted image 56'.

An aperture 42 defined by the periphery of an opening in an aperture screen 40 is used to select an image 50' on the mask 30 which will be imprinted on the photoresist of the substrate 20. The aperture 42 in one embodiment is positioned between the mask 30 and the substrate 20 so as to transmit radiation which passes through the selected image 50' of mask 30 and to block radiation which passes through the undesired images 50 of mask 30. Alternatively, in one embodiment the aperture screen 40' is positioned between the mask 30 and the source 10. In this embodiment radiation passes through the aperture 42' before passing through the selected image 50' of mask 30. In one embodiment, the aperture 42, 42' is depicted as being defined by an opening in a single screen. Alternatively, the aperture 42, 42' in one embodiment is defined by the edges of a plurality of screens, which are all movable relative to each other, and which may be positioned to define the aperture 42, 42' as described below. In one embodiment, the distance between the mask 30 and the aperture 42 is adjustable. This distance is chosen to control diffraction effects which generally occur as a result of the interaction of electromagnetic radiation with an edge, such as the edges of aperture screen 40 which define aperture 42. In one embodiment, the diffraction effects are controlled by leaving a distance between adjacent imprinted images, generally 56', only one of which is shown.

In one embodiment source 10 is turned on for an interval suited to the imprinting of an image 56' upon substrate 20 and then turned off while the relative positions of substrate 20, mask 30, and aperture 42 are changed to allow the imprinting of another image. Alternatively, a movable shutter (not shown) may be used to temporarily intercept the radiation from source 10, so that an image 56' may be imprinted by adjusting the relative positions of the substrate 20, the mask 30, and the aperture 42 with the shutter closed, and then opening the shutter for a suitable length of time to imprint an image 56'. Another alternative uses a movable radiation diverter such as a mirror or a lens (not shown) to temporarily intercept the radiation.

Figure 2A:
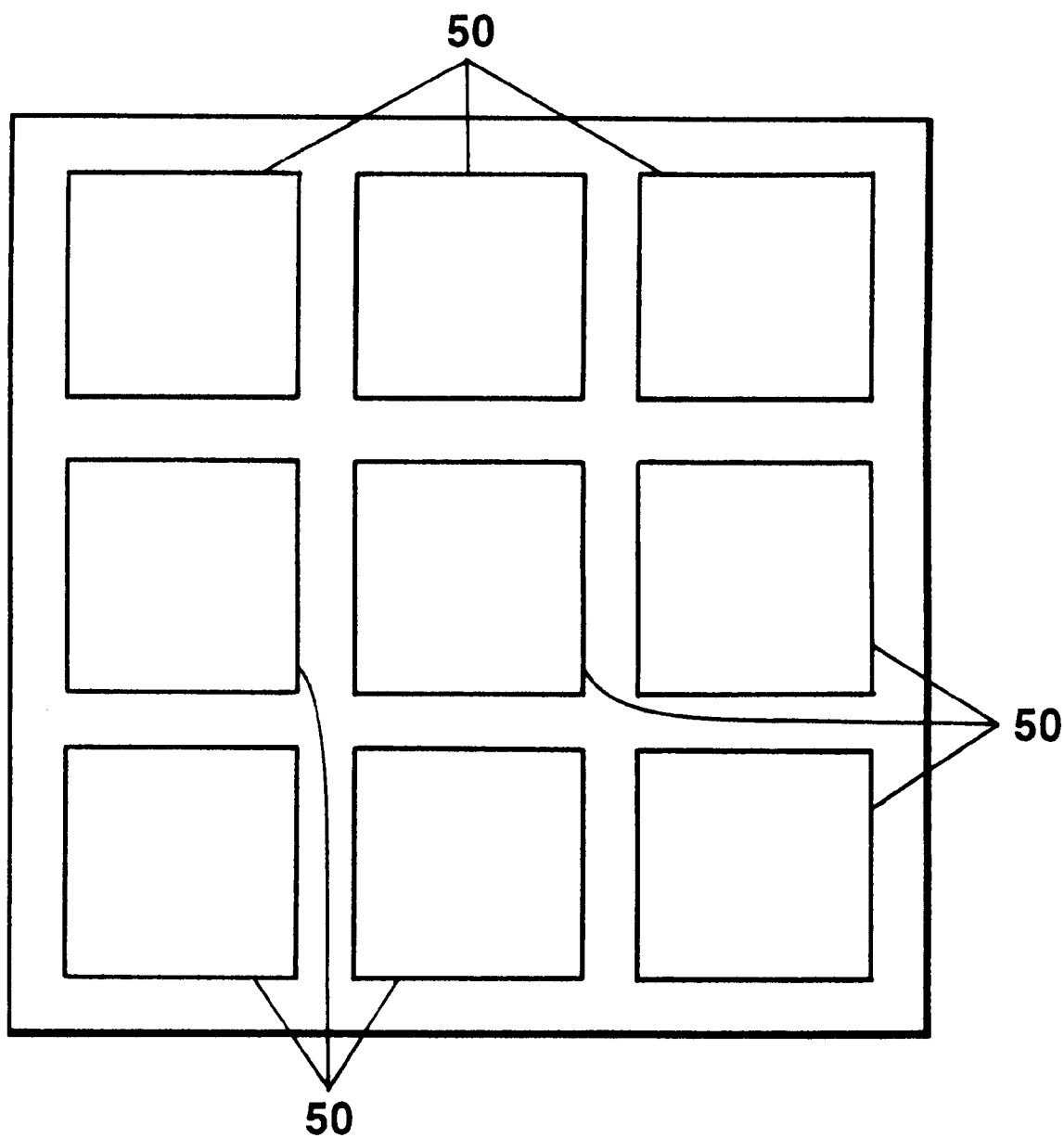
Figure 2C:
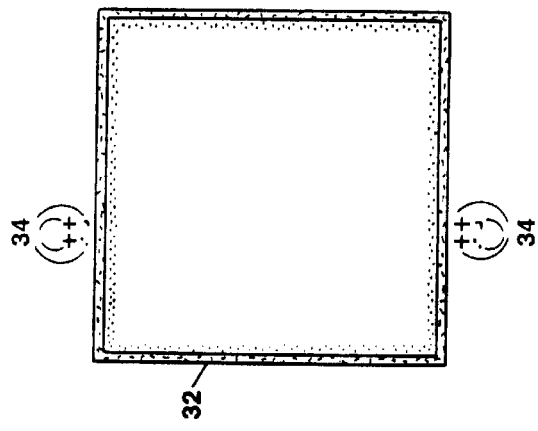
Figure 2E:
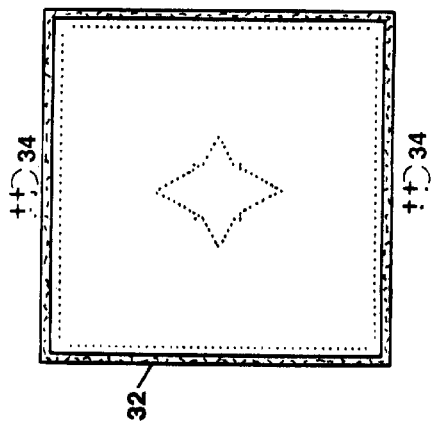
Figure 2B:
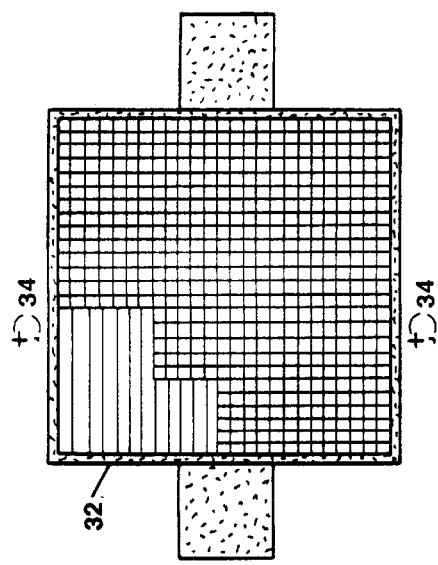
Figure 2D:
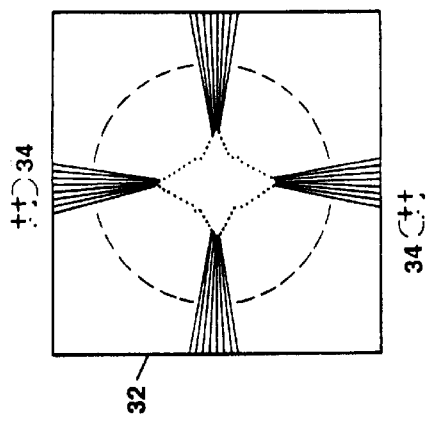
Figure 2G:
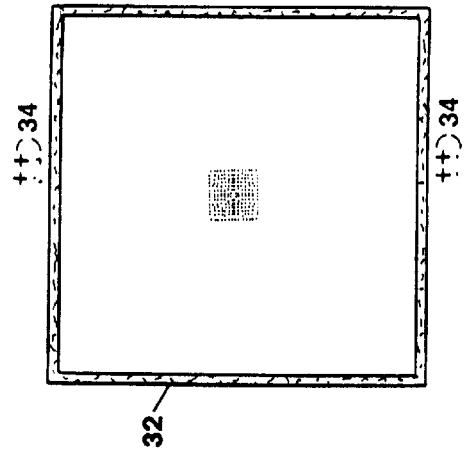
Figure 2I:
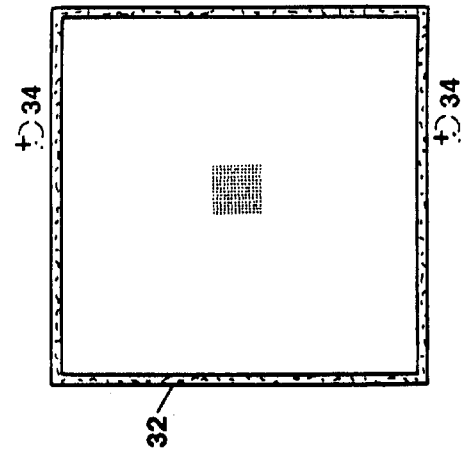
Figure 2F:
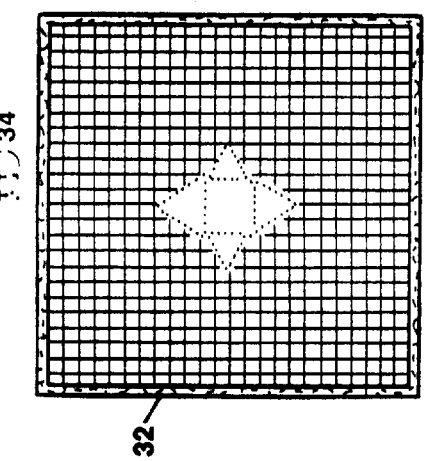
Figure 2H:
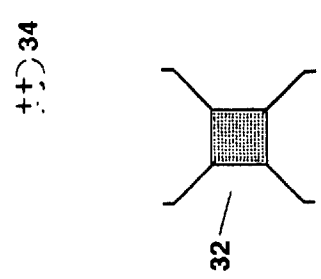
Figure 2J:
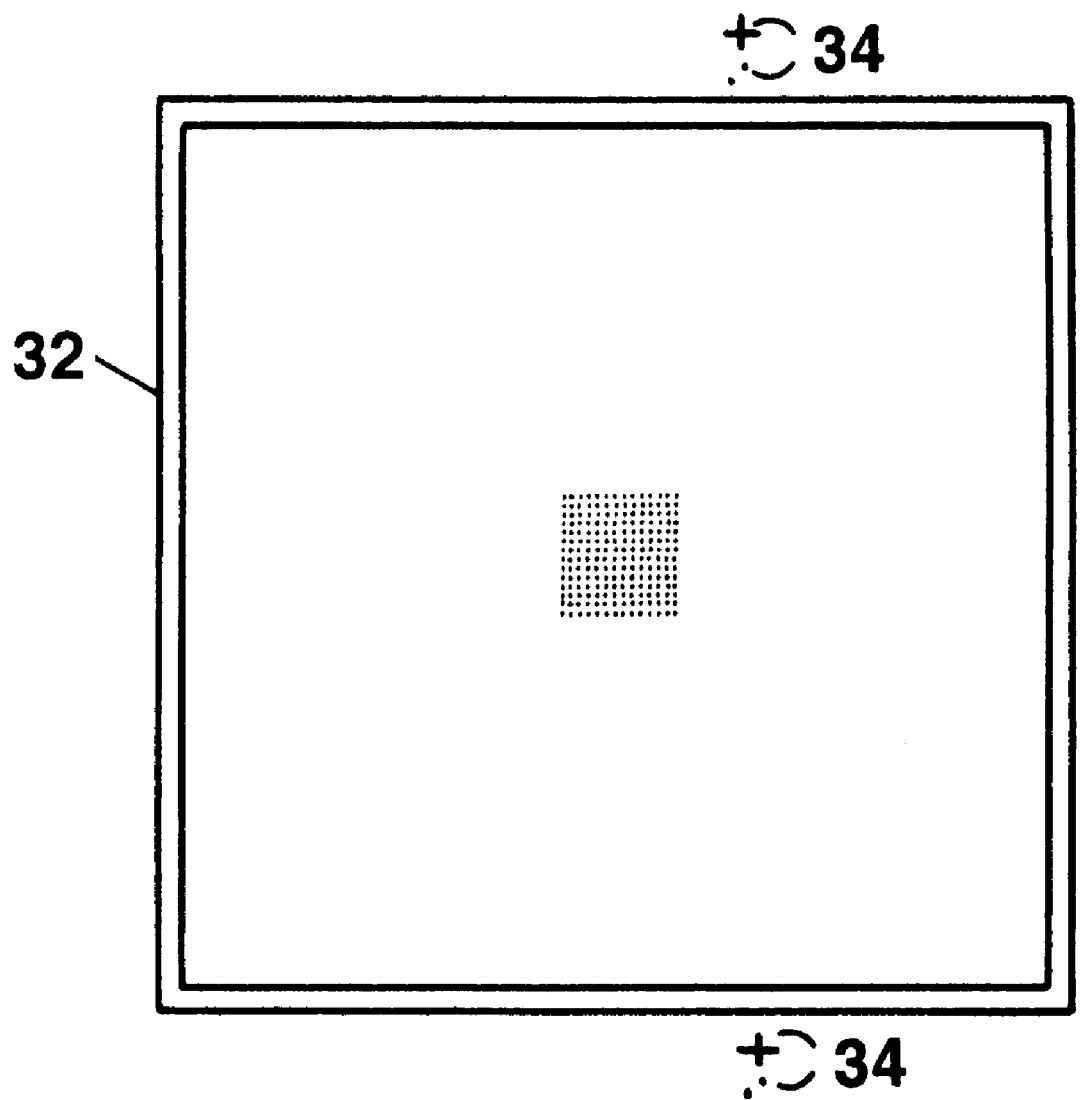

FIG. 2a depicts a mask 30 comprising a set of photolithographic images generally 50 for the manufacture of a circuit requiring multiple layers and several types of devices. Each image 50 represents a discrete layer which must be fabricated in manufacturing the circuit. FIGS. 2b through 2j depict the individual images in detail and in sequence from the bottom to the top of the circuit. Each figure represents one layer in which there is a cell of elements, generally 32, and fiduciary marks, generally 34. The fiduciary marks perform functions which include but are not limited to aligning the cell elements, orienting the cell to prevent or to identify inadvertent inversion of mask 30, and permitting the focusing of the image 50'. FIGS. 2b, 2d, 2f, and 2h depict images which are used to fabricate discrete layers of metallization. FIGS. 2c, 2e, and 2g depict the individual images which are used to fabricate "via" layers, or layers in which connections between layers of metallization are produced, creating a three dimensional serpentine conductive structure. FIG. 2i depicts an image which represents a pattern for the deposition of solder. FIG. 2j depicts an image which represents a pattern for the deposition of a multiplicity of circuit probe elements.

The mask 30 of FIG. 2a may be employed in the system depicted schematically in FIG. 1 so as to construct a circuit tester which is useful for testing a specific semiconductor circuit.

Figure 3:
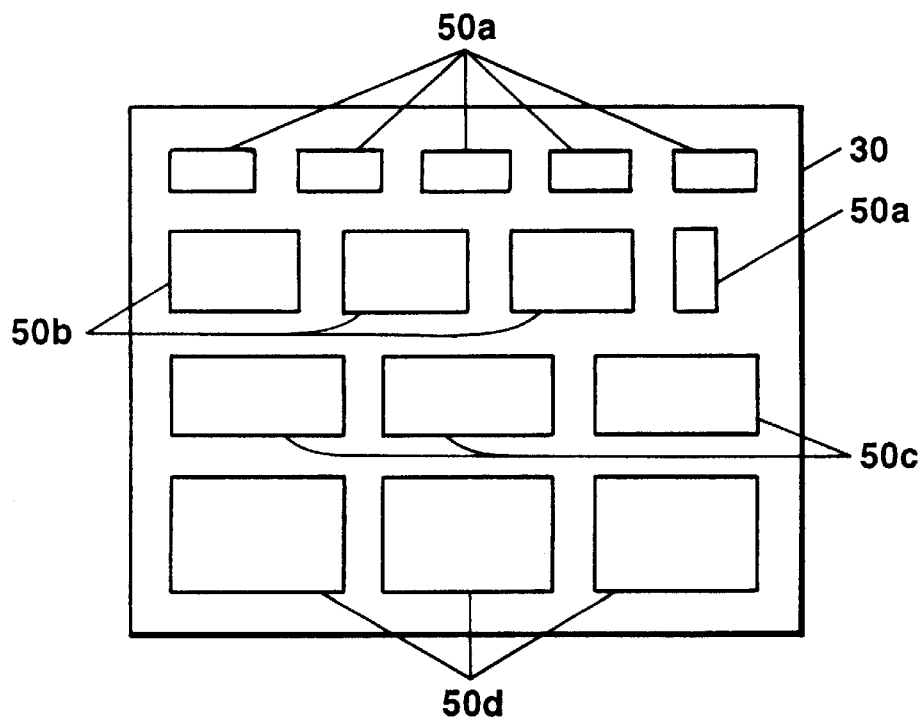
FIG. 3 depicts another embodiment of a mask constructed in accordance with the invention.

FIG. 3 depicts an embodiment of a mask 30 comprising a set of photolithographic images 50a, 50b, 50c, 50d for the manufacture of an integrated circuit having multiple layers and several devices. Images 50a, which have a rectangular area, are the individual layers in one device. One example of an image 50a is rotated by 90 degrees with respect to the orientation of the other images 50a, for example to use space on the mask efficiently. Mask 30 must thus be capable of being rotated by 90 degrees in order to imprint all of the images 50a. Images 50b, having a rectangular area which is somewhat larger and differently proportioned than the images for the first device, are individual layers for a second device. Images 50c, of rectangular shape which is still larger, are individual layers for a third device, and images 50d, which are the largest, are images corresponding to the individual layers of a fourth device. The mask of FIG. 3 is used in the apparatus depicted in FIG. 1.

Figure 4:
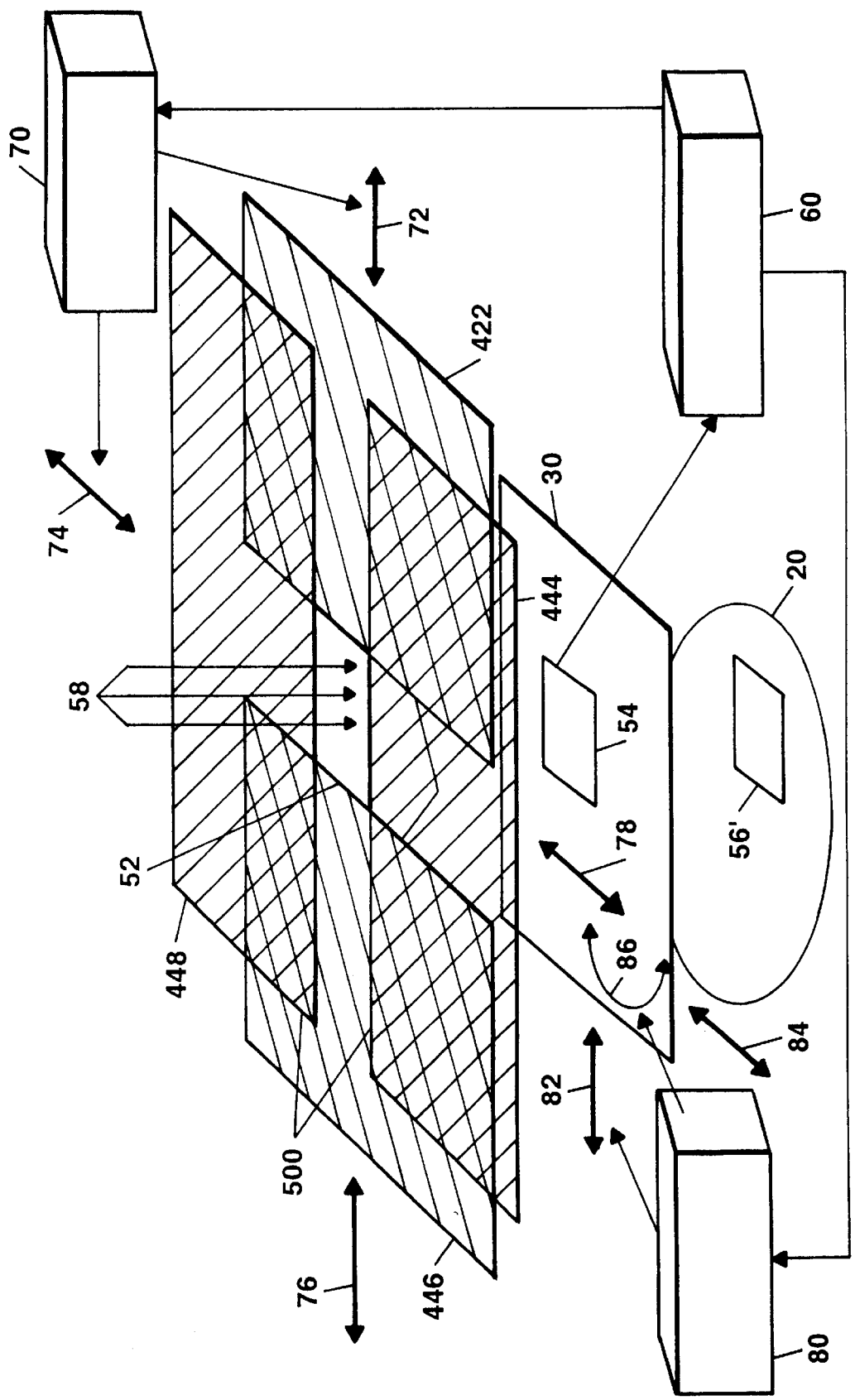
FIG. 4 depicts a perspective view of a highly schematic diagram of an embodiment of a photolithography system suitable for the practice of the invention.

FIG. 4 depicts a schematic diagram of another embodiment of a photolithography system suitable for the practice of the invention. A substrate 20 which is prepared for receiving an imprinted image 56' is provided. Mask 30, which carries a plurality of photolithographic images, generally 50, of which only image 54 is shown, is placed in registry with substrate 20 by the use of a microcontroller and motion drives 80. Microcontroller and motion drives 80 determine the positioning of mask 30 by allowing mask 30 to move rectilinearly in two mutually perpendicular directions shown as x-motion 82 and y-motion 84, and additionally in a rotational manner, depicted by curved arrow 86, along a rotation axis z which is perpendicular to the plane of the mask 30. Mask 30 can optionally further be positioned rectilinearly in the z-direction by a motion controller and a motion drive (not shown) so as to permit the distance between the substrate 20 and mask 30 to be controlled. A vision system 60, which is of a conventional kind for use in the photolithographic arts, uses fiduciary marks (not shown) on mask 30 and an auxiliary source of illumination (not shown) to determine the position of mask 30 relative to the position of substrate 20. Vision system 60 is in communication with microcontroller and motion drives 80 and sends a signal to microcontroller and motion drives 80 to adjust the position of mask 30 along any of its degrees of freedom until the mask 30 is correctly positioned. Radiation blocking screens 442, 444, 446, and 448 are each independently rectilinearly movable in one of two mutually perpendicular directions shown as x-motions 72 and 76 and y-motions 74 and 78. In one embodiment, the relative positions of the radiation blocking screens 442, 444, 446, and 448 along the z direction perpendicular to the plane of the mask 30 are adjustable by use of motion controllers (not shown). Motion controller and linear drives 70 controls the motion of screens 442, 444, 446, and 448 to define aperture 52 by the opening delineated by the overlap of the edges 500 of screens 442, 444, 446 and 448. Vision system 60 is in communication with microcontroller and linear drives 70 and can send a signal to microcontroller and linear drives 70 to adjust the positions of screens 442, 444, 446, and 448 along any of their degrees of freedom until the aperture 52 defined by the edges of the screens is correctly adjusted. Radiation 58 from a source (not shown) is then caused to illuminate mask 30 over the selected photolithographic image 54 so as to produce imprinted image 56' upon the photoresist on substrate 20, with radiation blocking screens 442, 444, 446 and 448 preventing the exposure of any other image carried on mask 30.

Figure 5:
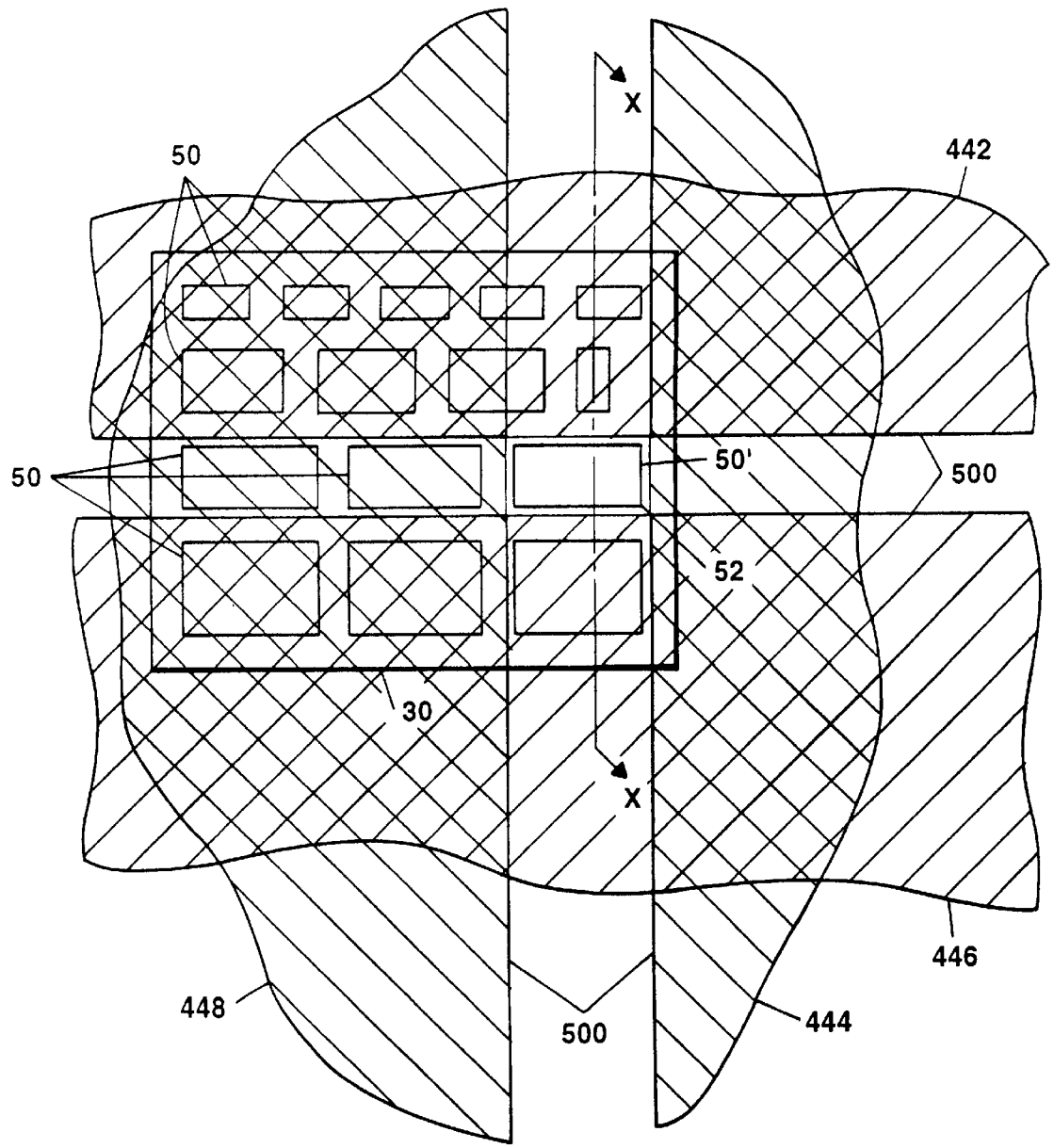
FIG. 5 depicts a plan view of the step of selection of an image from a set of photolithographic images on a mask according to an embodiment of the invention.

FIG. 5 depicts a plan view of the step of selection of an image from a set of photolithographic images according to one embodiment of the invention. Mask 30 comprises a set of photolithographic images generally 50 for the manufacture of a circuit requiring multiple layers and several types of devices. At a point in the processing of the circuit when image 50' is to be imprinted, mask 30 is aligned with the substrate (not shown) so that image 50' is in registry with the device of which it comprises one layer. Radiation blocking screens 442, 444, 446 and 448 are then individually positioned by being moved rectilinearly along axes of motion perpendicular to their edges generally 500, to define rectangular aperture 52. Aperture 52 defines the portion of mask 30 which will be illuminated by the source of electromagnetic radiation (not shown), and can thus select imaged 50' for imprinting while blocking the illumination of the remainder of mask 30. Line XX depicts the relative position of the side view (or vertical cross section) which is presented in FIG. 6.

Figure 6:
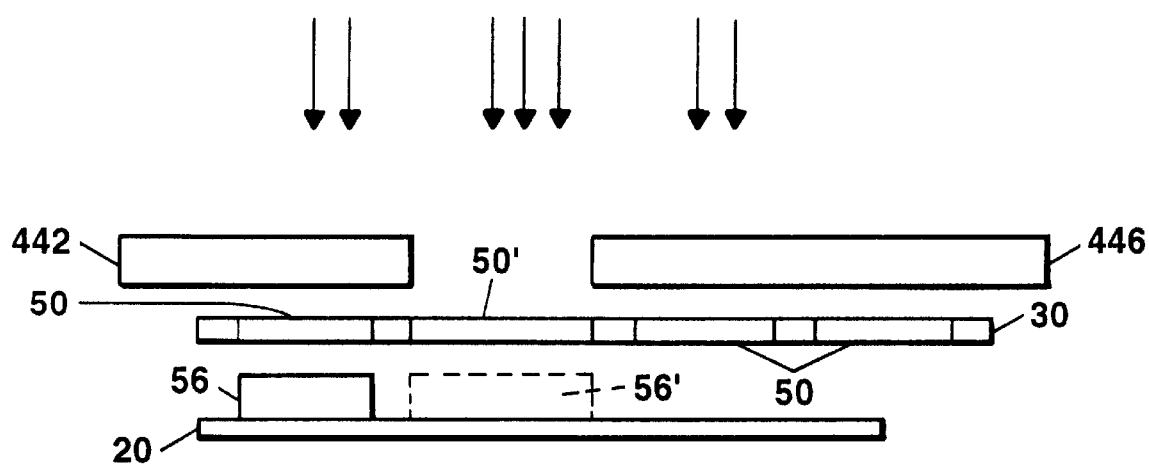
FIG. 6 depicts in side view diagram the steps of selecting and imprinting of a selected image on a substrate from a set of photolithographic images on a mask according to an embodiment of the invention.
Figure 7A:
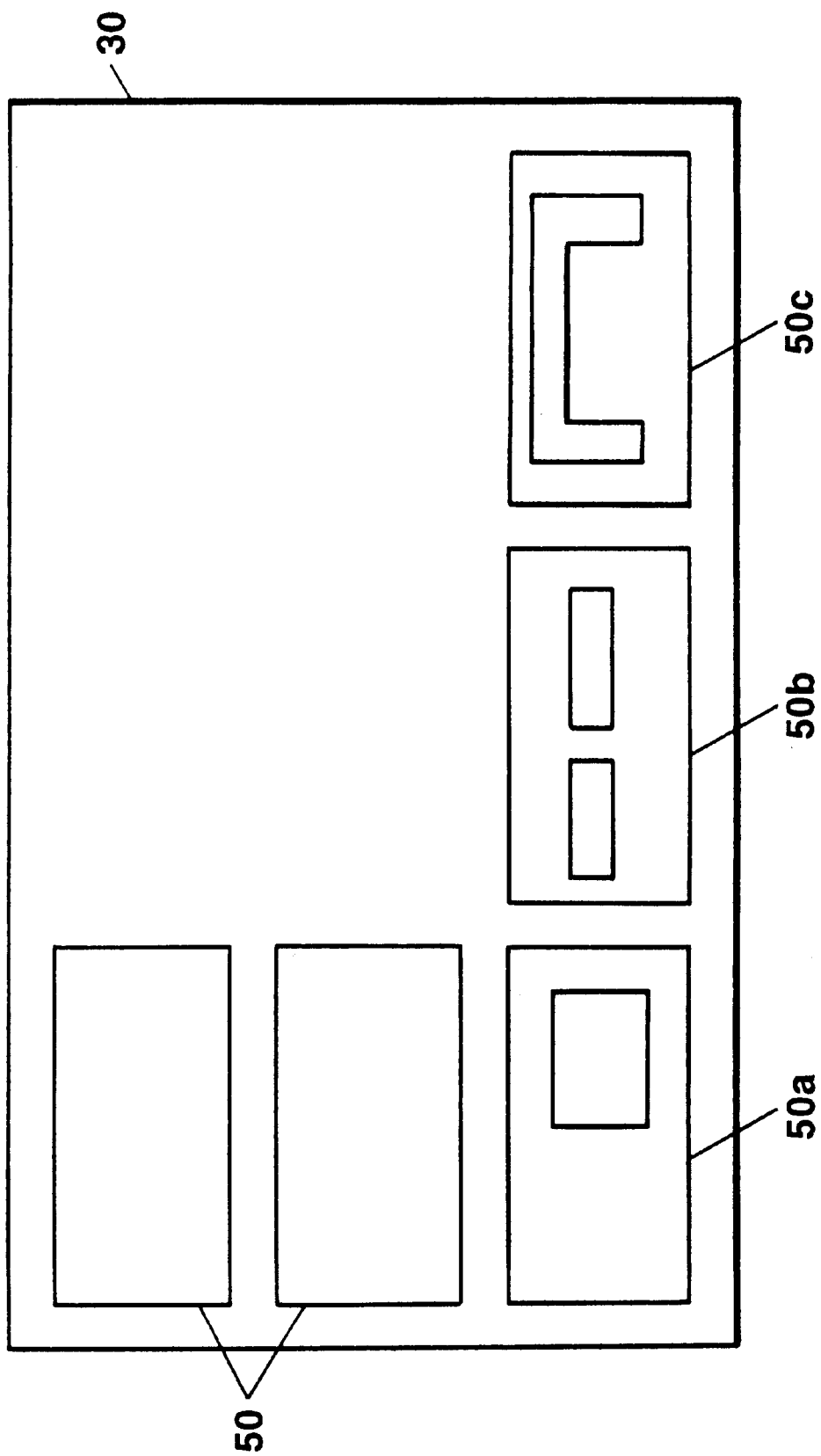
FIGS. 7a, b depict another embodiment of a mask and an aperture constructed in accordance with the invention.
Figure 7B:
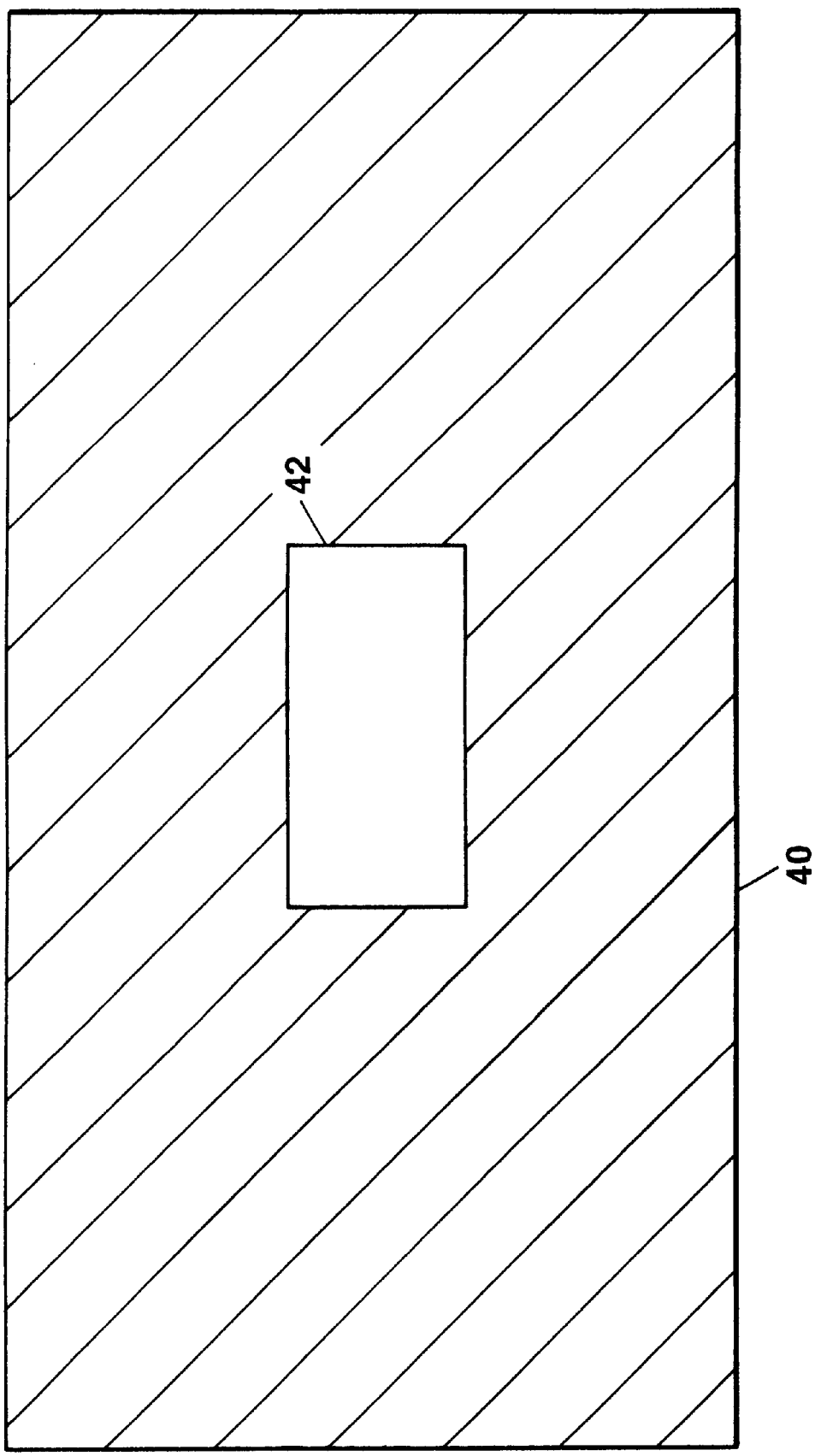

FIG. 6 depicts in cross section through line XX in FIG. 5 of the apparatus for selecting and imprinting a selected image on a substrate from a set of photolithographic images on a mask according to an embodiment of the invention. Substrate 20 is depicted with an imprinted image 56 thereon. A second image 56' (shown in phantom) is positioned for selection and imprinting adjacent to image 56. Mask 30 is disposed above substrate 20 and is positioned with image 50' in registry with substrate 20 such that the location of the imprinted image 56' will be adjacent to image 56. Additional images 50 are carried by mask 20. These images 50 are covered by the radiation blocking screens 442 and 446 which are disposed above mask 30 to define rectangular aperture 52. FIGS. 7a, b depict another embodiment of a mask 30 and an aperture 42, respectively, constructed in accordance with the invention. Mask 30 is depicted in FIG. 7a with a plurality of images 50. In the embodiment shown, one image 50a represents a layer of a silicon semiconductor device wherein a portion of the device area is prepared for exposure to a deliberately added impurity known in the art as a dopant, the addition of which changes the electrical properties of the silicon substrate. Another image 50b represents a layer of a silicon semiconductor device wherein selected regions of the surface of the silicon semiconductor are covered by a deliberately added thin oxide layer, which generally passivates the silicon semiconductor and may for example permit the creation of a field effect transistor or a tunnel junction device. A third image 50c represents a layer of a silicon semiconductor device wherein selected areas of the device are provided with a polysilicon layer, which may for example be used as a conductor, or as a gate electrode in a field effect transistor. Other images 50 (shown schematically) are typically provided to permit the fabrication of other silicon semiconductor device elements, as will be appreciated by those skilled in the art. In this embodiment, all of the images correspond to a single device, and they are all of the same overall shape and size. Accordingly, aperture screen 40 which is depicted in FIG. 7b is provided, which includes aperture 42 which is defined by the periphery of the rectangular opening constructed to be substantially commensurate with the dimensions and shape of images 50 of mask 30. Mask 30 and aperture screen 40 are employed as depicted in FIGS. 8a, b, c, to produce the structures depicted in FIGS. 9a, b, c, as described below.

Figure 8A:
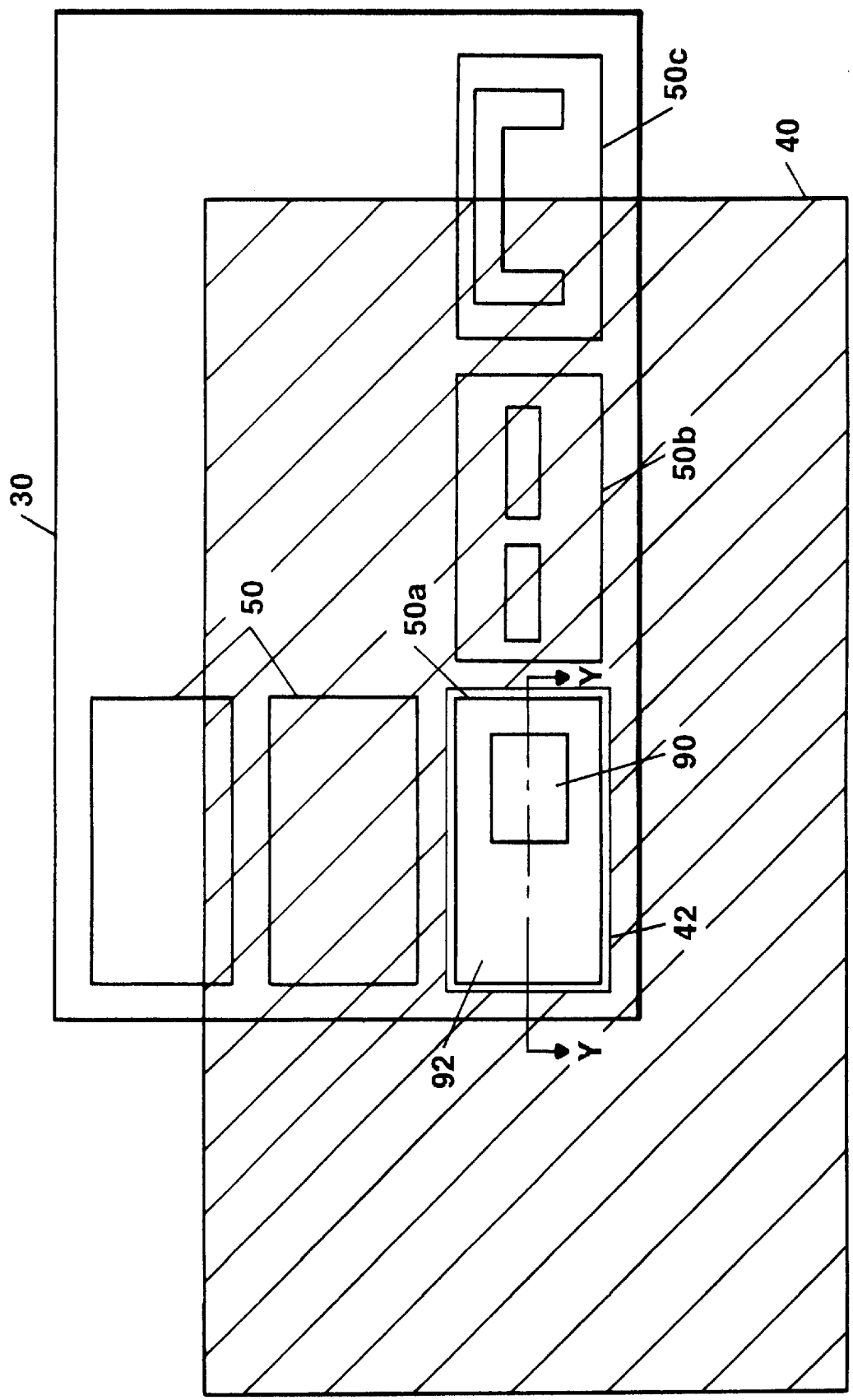
FIGS. 8a, b, c depict a plan view of the steps of selecting various mask images of the mask of FIG. 7a for manufacturing an integrated circuit according to the invention.
Figure 9A:
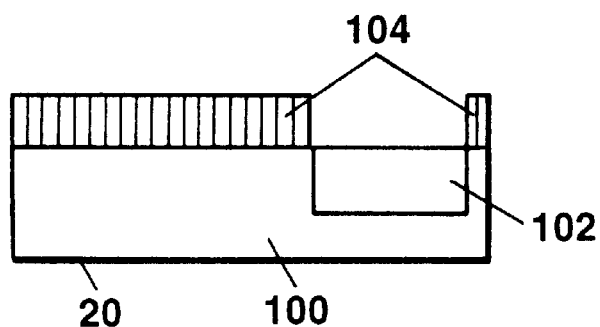
FIGS. 9a, b, c depict in cross section a partially manufactured integrated circuit manufactured according to the steps shown in FIGS. 8a, b, c.

FIGS. 8a, b, c depict in plan view the relative positions of the mask 30 and aperture 42 during the steps of selecting various mask images of the mask 30 of FIG. 7a for manufacturing an integrated circuit according to the invention. FIGS. 9a, b, c depict in cross section a partially manufactured integrated circuit manufactured according to the steps shown in FIGS. 8a, b, c. In FIG. 8a, mask 30 has been positioned such that the image 50a is in registry with the desired location on the substrate. In this embodiment, image 50a has an area 90 which is transparent with regard to the electromagnetic radiation emitted by source 10 (not shown) and another area 92 which is opaque to the electromagnetic radiation emitted by source 10.

For purposes of explanation, we shall assume that the photoresist used in this embodiment is softened by exposure to the radiation of source 10, that is, the area not exposed to radiation remains covered with photoresist, and the area exposed is washed clear of photoresist in processing steps subsequent to imprinting. Alternatively, one can obtain the same result by employing a photoresist which hardens upon exposure to the radiation of source 10, and reversing the character of areas 90 and 92, that is making area 90 opaque rather than transparent, and making area 92 transparent rather than opaque. Aperture screen 40 is positioned above mask 30 with aperture 42 (here shown somewhat larger in dimension than image 50 for clarity) aligned with image 50a. Image 50a' is then imprinted upon substrate 20. Line YY depicts the position of a vertical cross sectional view of the structure of the layer of the device being manufactured corresponding to image 50a', which is depicted in FIG. 9a. FIG. 9a depicts a substrate 20, which for example is a silicon semiconductor wafer, which has a region 100 having one conductivity type, which for example may be n-type. Area 102 corresponds to the area 90 of image 50a', which is an imprint of image 50a of FIG. 8a, which was then exposed to radiation, and whose photoresist cover was removed. Substrate 20 has a surface oxide 104 which is partially removed, in particular in area 102 where no photoresist remains. Upon further processing of substrate 20 with a dopant, such as boron or aluminum in the case of a silicon semiconductor wafer, area 102 becomes a p-type region, known in the art as a p-well. As is well known in the art, oxide 104 is then replaced with new oxide 104, and coated with photoresist (not shown).

Figure 9B:
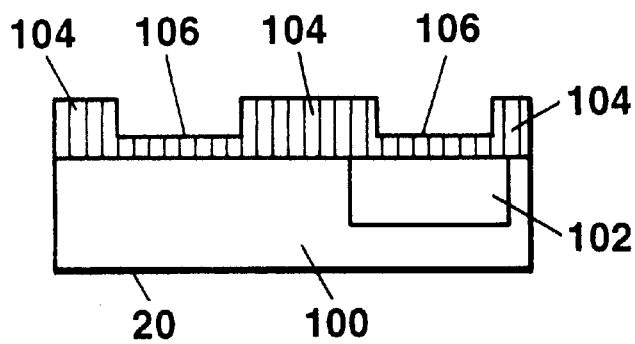

After the image 50a' has been imprinted on substrate 20, and after substrate 20 has been processed, substrate 20 is returned for the imprinting of another layer, the image of which is depicted in FIG. 8b. Mask 30 is then positioned above substrate 20 (not shown) and image 50b is aligned with the device of which image 50a constituted a layer. Aperture screen 40 is aligned with mask 30 so that aperture 42 permits image 50b to be illuminated and all other images 50 to be blocked from being illuminated. Image 50b' is then imprinted upon substrate 20. Again, line YY depicts the position of a vertical cross sectional view of the structure of the layer of the device being manufactured corresponding to image 50b', which is depicted in FIG. 9b. FIG. 9b depicts a substrate 20, which has been imprinted with image 50b', corresponding to image 50b of FIG. 8b, in registry with image 50a', and then processed, for example by an oxidation process such as steam oxidation, to produce layers 106 which are for example thin oxide.

Figure 8C:
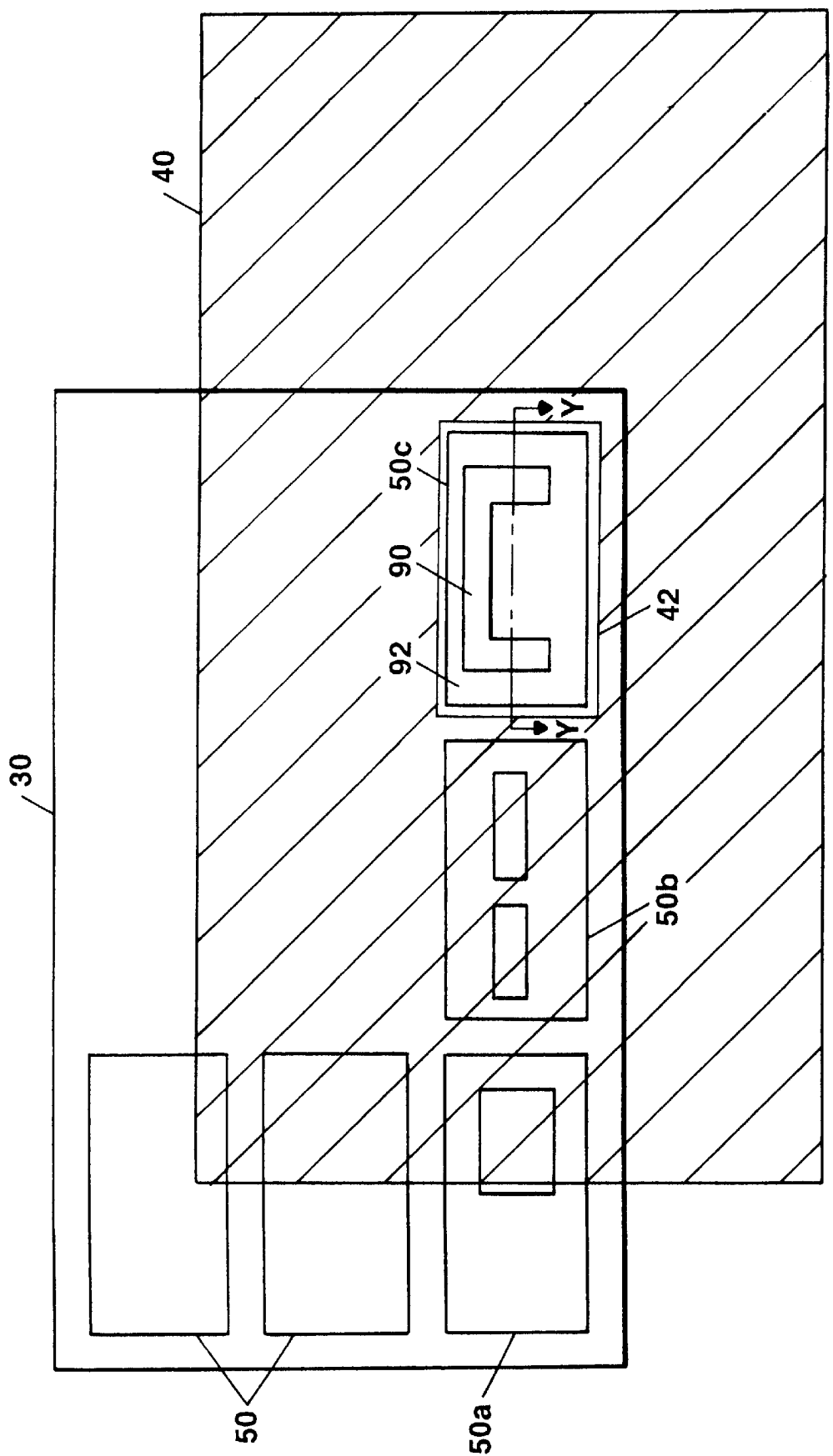
Figure 9C:
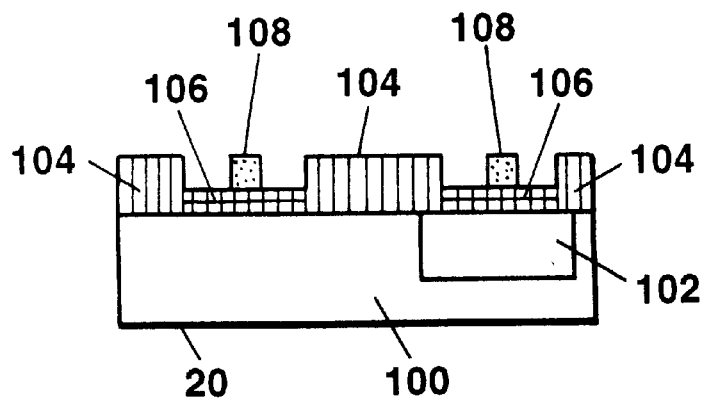

After the image 50b' has been imprinted on substrate 20, and after substrate 20 has been processed, substrate 20 is again returned for the imprinting of another layer, the image of which is depicted in FIG. 8c. Mask 30 is positioned above substrate 20 (not shown) as discussed previously and image 50c is aligned with the device. Aperture screen 40 is again aligned with mask 30 so that aperture 42 permits image 50c to be illuminated. Image 50c' is then imprinted upon substrate 20, the cross sectional view of which is depicted in FIG. 9c. FIG. 9c depicts a substrate 20, which has been further imprinted with image 50c', corresponding to image 50c of FIG. 8c, in registry with image 50a', and then processed, for example by deposition of polysilicon 108 to produce a conductor or a gate.

The embodiment illustrated in FIGS. 7, 8 and 9 depicts images which are of one shape and size. Another embodiment uses the mask of FIG. 3, which has images of a number of different shapes and sizes. In this embodiment, there are used a plurality of aperture screens 40, each having an aperture 42, as in FIG. 7b, one aperture screen 40 and aperture 42 adapted for use with one size and shape of image on mask 30. In one embodiment, the plurality of aperture screens 40 can be conveniently housed in a cassette (not shown) and used serially as necessary. As will be apparent to those knowledgeable in the art, in other embodiments of the invention, substrates of other semiconductors, such as for example silicon-germanium, III-V compounds such as gallium arsenide and indium phosphide and their alloys and the like, substrates of insulators, and substrates of metals may also be processed in similar fashion.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A photolithographic system for employing a photolithographic mask having a plurality of images, said system comprising;
    a source of electromagnetic radiation;
    a substrate support;
    a photolithographic mask positioner; and
    an aperture movably positioned between said source of electromagnetic radiation and said substrate support, wherein the aperture is moved to select an image from the plurality of images;
    one of said plurality of images is suited for the manufacture of a first device cell; and
    a second of said plurality of images is suited for the manufacture of a second device cell that is different from said first device cell.

2. A photolithographic system according to claim 1 wherein the aperture is an adjustable aperture.

3. A photolithographic system according to claim 2 wherein the adjustable aperture comprises a plurality of movable screens.

4. The photolithographic system as defined in claim 1 wherein said first and second device cells are each selected from one of the following types of devices: digital circuitry, analog circuitry, micro-mechanical devices, micro-electromechanical devices, electro-optic devices, optoelectronic devices, and electronic sensor devices.

5. The photolithographic system as defined in claim 4 wherein said first device cell and said second device cell belong to different ones of said types of devices.

6. The photolithographic system as defined in claim 1 wherein said plurality of images comprises a set of images required for the manufacture of a device comprising layers on said substrate.

7. The photolithographic system as defined in claim 6 wherein the images of photolithographic process layers of different devices are of different sizes.

8. The photolithographic system as defined in claim 1 wherein said first device cell and said second device cell are different types of devices from the following types of devices: resistors, capacitors, diodes, transistors, memory elements, logic gates, bridges, fulcrums, levers, gears, accelerometers, micromechanical motors, photodiodes, optical sensors, random access memories, central processing units, and charge-coupled devices.

9. The photolithographic system as defined in claim 1 wherein said plurality of images on said photolithographic mask include a set of photolithographic images for the manufacture of an integrated circuit having multiple layers and multiple devices with a plurality of such images corresponding to the multiple layers of an individual one of said devices.

10. The photolithographic system as defined in claim 1 wherein said plurality of images on said photolithographic mask include the images of multiple photolithographic process layers of each of multiple different devices.

11. A method of using the photolithographic system as defined in claim 10, said method comprising:
    repeatedly:
        exposing images corresponding to a given photolithographic process layer of different devices upon a given layer of photoresist placed upon a substrate supported by said substrate support; and processing the substrate with the exposed photoresist;

wherein said exposures of images of different devices on a given layer of photoresist are connected to form an integrated circuit comprised of such different devices.

12. A method of using the photolithographic system as defined in claim 16 to create a composite device composed of a plurality of said different devices corresponding to the images contained on said photolithographic mask, said method comprising:

repeating the following process for each layer of a photolithographic process as many times as is necessary to print the images required to manufacture a desired device one layer that time:

positioning the aperture between the source of electromagnetic radiation and a substrate placed upon said substrate support exposing the substrate to electromagnetic radiation through the aperture so as to imprint the first image upon the substrate;

repositioning the photolithographic mask relative to the substrate so the second of the images is in registry with the substrate; and repositioning the aperture to permit the second image to be projected on the substrate;

re-exposing the substrate to electromagnetic radiation through the aperture to imprint the second image upon the substrate.

* * * * *